United States Patent [19]
Jiang et al.

[11] Patent Number: 5,986,477
[45] Date of Patent: Nov. 16, 1999

[54] METHOD AND SYSTEM FOR PROVIDING AN INTERCONNECT LAYOUT TO REDUCE DELAYS IN LOGIC CIRCUITS

[75] Inventors: Chun Jiang, San Jose; Linda Milor, Stanford, both of Calif.

[73] Assignee: Advanced Micro Devices, Inc., Sunnyvale, Calif.

[21] Appl. No.: 08/940,247

[22] Filed: Sep. 30, 1997

[51] Int. Cl.⁶ .......................... H01L 21/768; H01L 23/535
[52] U.S. Cl. ............................. 326/101; 257/775
[58] Field of Search ..................... 326/101–103; 438/6; 257/775

[56] References Cited

U.S. PATENT DOCUMENTS

| | | | |
|---|---|---|---|
| 4,445,266 | 5/1984 | Mai et al. | 29/571 |
| 5,372,969 | 12/1994 | Moslehi | 437/195 |

Primary Examiner—David Mis
Attorney, Agent, or Firm—Sawyer & Associates

[57] ABSTRACT

A system and method for providing a plurality of interconnects for a microcircuit is disclosed. The microcircuit has a plurality of functional components. The method and system include determining the placement of each of the plurality of functional components and determining a width of each of the plurality of interconnects. The determination of the width is based on a capacitance between each interconnect and a portion of the plurality of interconnects.

26 Claims, 2 Drawing Sheets

METHOD AND SYSTEM FOR PROVIDING AN INTERCONNECT LAYOUT TO REDUCE DELAYS IN LOGIC CIRCUITS

FIELD OF THE INVENTION

The present invention relates to logic circuit and more particularly to a method and system for mapping interconnects for a logic circuit which reduces the delays.

BACKGROUND OF THE INVENTION

Interconnects are utilized to carry signals from one portion of a microcircuit to another portion of the microcircuit. All circuits have a delay associated with them. A portion of this delay is due to the interconnects, which introduce a delay when transmitting a signal from one component in the circuit to another. The delay introduced by an interconnect is related to the geometry of the interconnect, the resistance of the interconnect, the load on the interconnect, the capacitance of the interconnect to ground, and any coupling between the interconnect and other structures or interconnects in the circuit. For example, the delay due to the capacitance of the interconnect is related to the time taken to charge or discharge the capacitance. The delay due to the interconnect also relates to the voltage input to the interconnect, the resistance of the interconnect and the driving current of the transistor charging or discharging the interconnect. It any microcircuit, a reduction of the delay is beneficial to performance. Thus, it is desirable to minimize the delay introduced by interconnects.

When designing a logic circuit, the structure for and position of interconnects in the logic circuit are generally determined automatically by a router. Typically, the pitch, and width of an interconnect as well as the separation between interconnects are assigned by the router. The pitch is sum of the width of an interconnect and the space between interconnects. The width of each interconnect is typically fixed. Using the fixed width of each interconnect, the position and length of each interconnect, as well as the separation between each interconnect can be determined. The circuit can then be fabricated using the output of the router.

Because the width of the interconnect is fixed, the delay introduced due to the interconnect can be reduced. In order to reduce delays due to interconnects, conventional systems try to minimize interconnect length, and consequently, indirectly try to reduce the contribution of delay due to interconnect. What is needed to reduce this delay are more flexible routers which can also vary the width of interconnect lines. The present invention addresses such a need.

SUMMARY OF THE INVENTION

The present invention provides a method and system for providing a plurality of interconnects for a microcircuit. The microcircuit has a plurality of functional components. The method and system comprise determining the placement of each of the plurality of functional components and determining a width of each of the plurality of interconnects. The determination of the width is based on a capacitance between each interconnect and a portion of the plurality of interconnects.

According to the system and method disclosed herein, the present invention can reduce delays introduced by interconnects, thereby increasing overall system performance.

DETAILED DESCRIPTION OF THE INVENTION

Figure 1A:
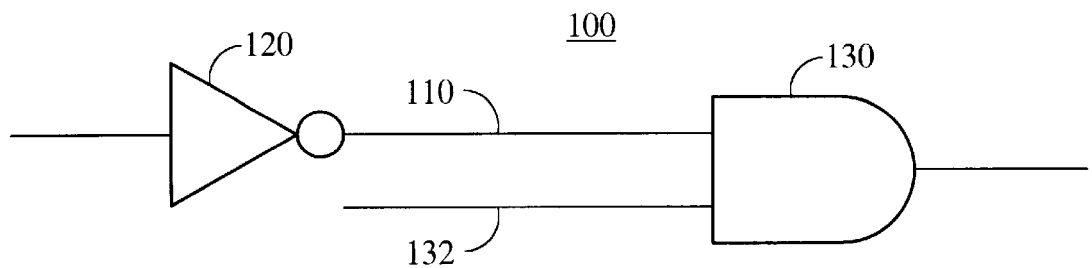
FIG. 1A is a block diagram of a portion of a microcircuit.

The present invention relates to an improvement in microcircuits. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

A delay introduced by an interconnect is related to the geometry of the interconnect, the resistance of the interconnect, the capacitance of the interconnect to ground, the load on the interconnect, and any coupling between the interconnect and other structures or interconnects in the circuit. For example, it is known that the delay due to an interconnect is related to both the capacitance to ground and the capacitance between the interconnect and other interconnects. For a derivation of the delay due to coupling capacitances, see Takayasu Sakurai, "Closed-Form Expressions for Interconnection Delay, Coupling, and Crosstalk in VLSI's", IEEE Transactions on Electronic Devices, pp. 118–124, 1993. The delay due to the interconnect is also related to the voltage and current input to the interconnect. In any microcircuit, a reduction of the delay is beneficial to performance. Thus, it is desirable to minimize the delay introduced by interconnects.

Conventional routers map out the structure and position of interconnects. Typically, the functional components of the microcircuit are positioned using a set of predetermined criteria including, for example, the relationship between the duties of each functional component. The interconnects are then typically mapped. Conventional interconnects have a fixed width. Once the width of all interconnects is fixed, the length and position of each interconnect as well as the separation between interconnects are set based on a variety of criteria. The microcircuit can then constructed.

Although interconnects can be adequately placed using conventional methods, those with ordinary skill in the art will realize that because the width of the interconnect is fixed, the delay due to the interconnect can be reduced. In order to reduce delays due to interconnects, some conventional research systems add the feature of accounting for the capacitance of the interconnect to ground and the resistivity of the interconnect. See, for example, Chung-Ping Chen, et al. "Optimal Non-Uniform Wire-Sizing Under the Elmore Delay Model," IEEE, pp. 38–43, 1996. In addition, commercially available routers still utilize constant width interconnects. However, significant delays are still introduced by interconnects optimized by these systems, partially because they do not account for properly the significant capacitances coming from coupling between interconnect lines.

The present invention provides for a method and system for reducing delays due to interconnects by taking into account the capacitances between interconnects. The present invention will be described in terms of interconnects for a CMOS logic circuit. However, one of ordinary skill in the art will readily recognize that this method and system will operate effectively for other types of microcircuits.

To more particularly illustrate the method and system in accordance with the present invention, refer now to FIG. 1A depicting a block diagram of one embodiment of a portion of a microcircuit 100 in accordance with the method and system. The portion 100 shown includes an inverter 120 connected to an AND gate 130 by an interconnect 110. Also depicted are interconnects 122, 132, and 134. The interconnect 122 couples the input of the inverter 120 to another functional component (not shown). The interconnects 132 and 134 couple the second input and output of the AND gate 130 to other functional components (not shown). Although specific logic gates 120 and 130 are shown, nothing prevents the use of other functional components. In a preferred embodiment, portion 100 is part of a CMOS microcircuit.

Figure 1B:
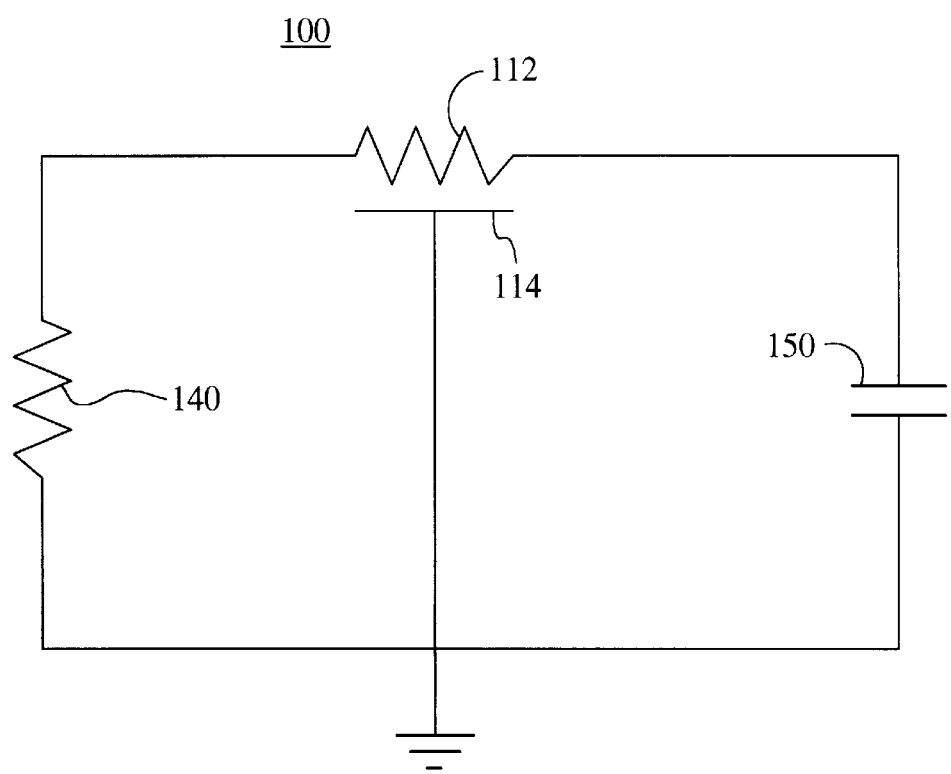
FIG. 1B is a block diagram representing the portion of the microcircuit.

Refer now to FIG. 1B depicting representation of the portion of the microcircuit 100. The interconnect 110 is represented by a resistance 112 and a capacitance 114. The logic gates 120 and 130 are represented by the load resistance 140 and the load capacitance 150. The driver resistance 140 is related to the driver's supply voltage and the driver's current.

The resistance 112 and capacitance 114 of the interconnect 110 are related to a unit resistance and a unit capacitance, respectively, as well as the interconnect 110 length. The unit resistance and capacitances are related to the geometry of the interconnect 110, including the interconnect 110 height and width. The capacitance 114 of the interconnect 110 depends both on the capacitance between the interconnect 110 and a layer above or below the interconnect 110, as well as the capacitances between the interconnect 110 and another interconnect in the same layer, not shown.

The delay due to the interconnect 110 partially results from the time taken to charge or discharge the relevant capacitances. Thus, the interconnect 110 delay depends on the driver's resistance 140, the load capacitance 150, the interconnect resistance 112 and the interconnect capacitance 114. In particular, the interconnect 110 delay is roughly proportional to: the sum of components due to the product of the load resistance 140 and the load capacitance 150; the product of the interconnect resistance 112, the load capacitance 150, and the interconnect 110 length; the product of the interconnect capacitance 114, the driver's resistance 140; and the product of the interconnect resistance 112, the interconnect capacitance 114, and the square of the interconnect 100 length. The delay also depends on the voltage input to the interconnect 110 and the driving current for the gates 120 and 130. Thus, the delay can be expressed as:

$$A*R_1*C_1+B*C_i*R_1*L+D*C_1*R_i*L+E*C_i*R_i*L^2 \qquad (1)$$

where:
A, B, D, and E are coefficients,
$R_1$ is the driving voltage divided by the driving current,
$C_1$ is the load capacitance,
$C_i$ is the interconnect capacitance 114,
$R_i$ is the interconnect resistance 112, and
L is the length of the interconnect.
The coefficients can depend on the shape of the voltage input function provided to the interconnect.

The method and system determine the width of the interconnect 110 to reduce the interconnect 110 delay, including the delay due to the capacitance between interconnects. In one embodiment, the method and system use the interconnect delay, as expressed above, to aid in determining the width of each interconnect. Thus, the width of the interconnect 110 is partly determined by the interconnect capacitance 114, including the capacitance between interconnects. In one embodiment, the length, height, and resistance 112 of the interconnect may be accounted for in determining the width. In one embodiment, the voltage input to the interconnect 110 from the gate 120 is also accounted for in determining the width.

For example, in one embodiment, the width of the interconnect 110 is partly determined with reference to the delay given by:

$$0.69*R_1*C_1+0.69*C_i*R_1*L+0.69*C_1*R_i*L+0.38*C_i*R_i*L^2 \qquad (2)$$

The coefficients in this embodiment are determined in part by taking the voltage input to the interconnect 110 as a step voltage and making a numerical calculation of the expected value of the coefficients in equation (1). Once the coefficients are determined as in equation (2), the width of each interconnect can be set in part to reduce the delay.

In order to illustrate the dependence of the width of the interconnect 110 on the capacitance between interconnects and other factors discussed above, the following example is given. The example is not intended to be numerically accurate for a particular interconnect 110 and is, therefore, for illustrative purposes only.

The interconnect resistance 112 is $\rho*L/(w*h)$, where $\rho$ is the resistivity of the interconnect, L is the length of the interconnect, w is the width of the interconnect, and h is the height of the interconnect. The interconnect capacitance 114 includes the capacitance between the interconnect 110 and other interconnects in the same layer, which neighbor the interconnect as well as the capacitance of the interconnect 110 to a layer below and above the interconnect 110. For example, one nearest neighbor to the interconnect 110 in the same layer is the interconnect 132. The capacitance 114 of the interconnect can be given by $2*\epsilon*(w/d+h/s)$, where $\epsilon$ is the permittivity of the dielectric, w and h are previously defined, s is the distance between interconnects, and d is the distance to a metal interconnect in a layer below and/or above the interconnect 110. Using equation (1) and taking all the terms not depending on the width to be a constant F, the interconnect 110 delay is:

$$F+B*R_1*\epsilon*(2*w/d)*L+D*C_1*\rho*L/(w*h)+E*\rho*\epsilon*L^2*2/(w*s) \qquad (3)$$

The width can be partly determined to reduce the interconnect 110 delay which takes into account the delay due to the capacitance between interconnects. In addition, because the delay expressed in equations (1), (2), and (3) depends on the length of the interconnect 110, and the voltage input to the interconnect 110, the width can also be partly determined by taking into account the length of the interconnect 110 and the voltage input to the interconnect 110 in an effort to reduce the interconnect 110 delay. Finally, note that there may also be other considerations in the determination of the width of the interconnect 110. As a result, reduction of the delay due to the interconnect 110 may be just one factor in final determination of the interconnect 110 width.

Figure 2:
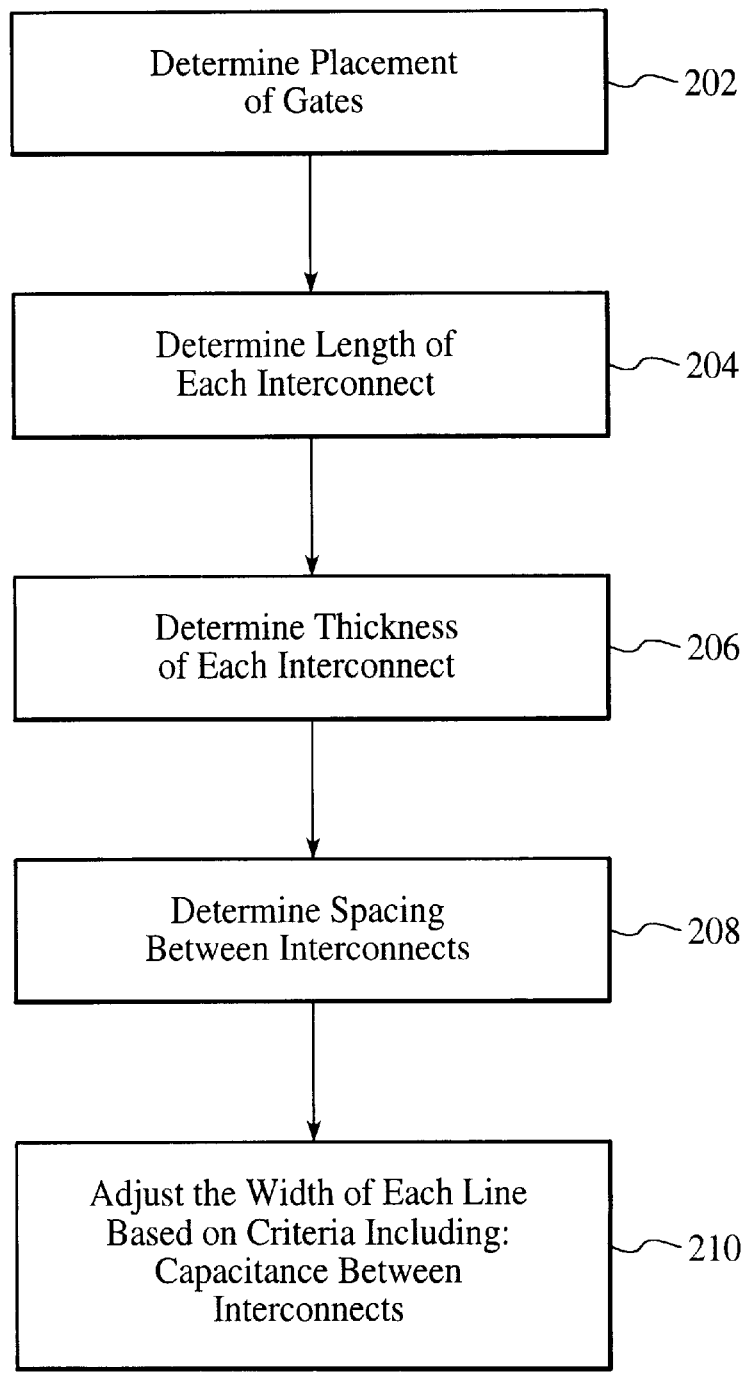
FIG. 2 is a is a flow chart depicting a method for providing interconnects in accordance with the method and system.

FIG. 2 depicts a method 200 for determining the width of interconnects in accordance with the method and system. The placement of logic gates and other functional components is first determined via step 202. In the method 200, the length, thickness, and spacing of each interconnect are then determined via steps 204, 206, and 208, respectively. Note that steps 204, 206, and 208 may be carried out at a different time and in a different order than shown in FIG. 2. The width of each interconnect is then set and adjusted based on a variety of criteria including the delay induced by the capacitance between interconnects in step 210. Other criteria for adjusting the width of the interconnects include but are not limited to the length of each interconnect and the voltage input to each interconnect. Once the width of each interconnect is determined via step 200, a microcircuit having the appropriate sized interconnects can be fabricated.

Note that because the identity and positioning of the functional components, and the length and positioning of the interconnects may depend on a variety of criteria including the specific microcircuit being fabricated, the optimal width of a particular interconnect can vary. However, the method and system determine the optimal width of an interconnect at least partly based on the delay due to the capacitance between the interconnect and at least one other interconnect.

A method and system has been disclosed for varying the width of an interconnect in order to reduce the delay due to the interconnect where the delay due to the interconnect may include delays due to the capacitance of the interconnect, including capacitance between interconnects.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a plurality of interconnects for a microcircuit having a plurality of functional components, the method comprising the steps of:

determining a placement of each of the plurality of functional components; and determining a width of each of the plurality of interconnects based on a capacitance between each interconnect and a portion of the plurality of interconnects.

2. The method of claim 1 wherein the microcircuit is further characterized by a delay; and wherein the width determining step further comprises the step of:

determining the width of each of the plurality of interconnects to reduce a portion of the delay due to the capacitance between each interconnect and the portion of the plurality of interconnects.

3. The method of claim 1 wherein the microcircuit is further characterized by a delay; and wherein the width determining step further comprises the step of:

determining the width of each of the plurality of interconnects to reduce a portion of the delay due to the resistance of the interconnect.

4. The method of claim 1 further comprising the step of:

determining a length for each of the plurality of interconnects; and wherein the width determining step further comprises the step of:

setting the width of each of the plurality of interconnects based on the length.

5. The method of claim 1 wherein the width determining step further comprises the step of:

determining the width of each of the plurality of interconnects based on a voltage to be input to the interconnect.

6. The method of claim 1 further comprising the step of:

determining a position of each of the plurality of interconnects based on the capacitance between each interconnect and a second portion of the plurality of interconnects.

7. The method of claim 1 wherein the length determining step further comprises the step of:

determining a length of each of the plurality of interconnects based on the capacitance between each interconnect and a second portion of the plurality of interconnects.

8. The method of claim 1 wherein the capacitance between each interconnect and the portion of the plurality of interconnects further comprises a capacitance between each interconnect and at least one nearest neighboring interconnect of the plurality of interconnects.

9. The method of claim 1 wherein the width determining step further comprises the step of:

determining the width based on a second capacitance between each interconnect of the plurality of interconnects and a layer below the interconnect.

10. A system for providing a plurality of interconnects for a microcircuit including a plurality of functional components comprising the steps of:

means for determining a position of the plurality of functional components; and means for determining a width of each of the plurality of interconnects, the width determining means setting the width based on a capacitance between each interconnect and a portion of the plurality of interconnects.

11. The system of claim 10 wherein the microcircuit is further characterized by a delay; and wherein the width determining means further comprise:

means for setting the width of each of the plurality of interconnects to reduce a portion of the delay due to the capacitance between each interconnect and the portion of the plurality of interconnects.

12. The system of claim 10 wherein the microcircuit is further characterized by a delay; and wherein the width determining means further comprise:

means for setting the width of each of the plurality of interconnects to reduce a portion of the delay due to the resistance of the interconnect.

13. The system of claim 10 further comprising:

means for determining a length of each of the plurality of interconnects; and wherein the width determining means further comprise:

means for setting the width of each of the plurality of interconnects based on the length.

14. The system of claim 10 wherein the width determining means further comprise:

means for setting the width of each of the plurality of interconnects based on a voltage to be input to the interconnect.

15. The system of claim 10 wherein the length determining means further comprise:

means for determining a position of the plurality of interconnects based on the capacitance between each interconnect and a second portion of the plurality of interconnects.

16. The system of claim 10 further comprising:

means for determining the length of each of the plurality of interconnects based on the capacitance between each interconnect and a second portion of the plurality of interconnects.

17. The system of claim 10 wherein the capacitance between each interconnect and the portion of the plurality of interconnects further comprises a capacitance between each interconnect at least one nearest neighboring interconnect of the plurality of interconnects.

18. The system of claim 10 wherein the width determining means further comprise:

means for determining the width of each of the plurality of interconnects based on a capacitance between each of the plurality of interconnects and a layer disposed below the interconnect.

19. A microcircuit comprising:

a plurality of functional components; and a plurality of interconnects for electrically coupling the plurality of functional components, each of the plurality of interconnects having a width, the width of each of the plurality of interconnects being determined based on a capacitance between each interconnect and the portion of a plurality of interconnects.

20. The microcircuit of claim 19 wherein the microcircuit is further characterized by a delay; and wherein the width of each of the plurality of interconnects is determined to reduce a portion of the delay due to the capacitance between each interconnect and the portion of the plurality of interconnects.

21. The microcircuit of claim 19 wherein each of the plurality of interconnects is characterized by a length, the width of each of the plurality of interconnects being based on the length of the interconnect.

22. The microcircuit of claim 19 wherein the width is further determined based on a voltage to be input to the interconnect.

23. The microcircuit of claim 19 wherein the capacitance between each interconnect and the portion of the plurality of interconnects further comprises a capacitance between at least one nearest neighboring interconnect of the plurality of interconnects.

24. The microcircuit of claim 19 wherein the length of each of the plurality of interconnects is based on the capacitance between each interconnect and a second portion of the plurality of interconnects.

25. The microcircuit of claim 19 wherein each of the plurality of interconnects further comprises a thickness, the thickness of each of the plurality of interconnects being based on the capacitance between each interconnect and a second portion of the plurality of interconnects.

26. The microcircuit of claim 25 wherein an interconnect of the plurality of interconnects is separated from another of the plurality of interconnects by a spacing, the spacing being based on a capacitance between the interconnect and the portion of the plurality of interconnects.

\* \* \* \* \*